United States Patent
Lee (10) Patent No.: US 12,244,281 B2
(45) Date of Patent: Mar. 4, 2025

(54) ADAPTIVE SOUND CONTROL SYSTEM AND METHOD OF ACTIVE SOUND DESIGN SYSTEM

(71) Applicant: HYUNDAI MOBIS CO., LTD., Seoul (KR)

(72) Inventor: Jae Young Lee, Icheon-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 311 days.

(21) Appl. No.: 18/146,397

(22) Filed: Dec. 26, 2022

(65) Prior Publication Data
US 2023/0421125 A1 Dec. 28, 2023

(30) Foreign Application Priority Data
Jun. 28, 2022 (KR) .......................... 10-2022-0078613

(51) Int. Cl.
*H03G 3/32* (2006.01)
*G06F 16/65* (2019.01)

(52) U.S. Cl.
CPC ............... *H03G 3/32* (2013.01); *G06F 16/65* (2019.01)

(58) Field of Classification Search
None
See application file for complete search history.

(56) References Cited

U.S. PATENT DOCUMENTS

| | | | | |
|---|---|---|---|---|
| 9,202,456 | B2* | 12/2015 | Lee | G10K 11/17837 |
| 10,631,107 | B2* | 4/2020 | Thomsen | H04R 25/353 |
| 11,438,711 | B2* | 9/2022 | Sabin | G10L 25/84 |
| 12,093,608 | B2* | 9/2024 | D'Amato | G06F 3/165 |
| 2019/0355350 | A1* | 11/2019 | Jeyachandran | H03G 3/3005 |
| 2024/0296829 | A1* | 9/2024 | Grizzel | G10L 15/24 |

FOREIGN PATENT DOCUMENTS

KR 102139916 B1 7/2020

* cited by examiner

*Primary Examiner* — Paul W Huber
(74) *Attorney, Agent, or Firm* — Novo TechIP International PLLC (57) ABSTRACT

The present invention relates to an active sound design (ASD) system for adjusting and controlling a volume of a virtual engine sound/synthetic engine sound according to a vehicle speed, and to an adaptive sound control system and method of an ASD system capable of keeping driving sound quality constant by actively controlling the ASD sound in consideration of the in-vehicle noise level since an in-vehicle noise (background noise) level varies according to different conditions (road surface noise, wind noise, etc.) even with the same vehicle speed.

12 Claims, 4 Drawing Sheets

ADAPTIVE SOUND CONTROL SYSTEM AND METHOD OF ACTIVE SOUND DESIGN SYSTEM

CROSS-REFERENCE TO RELATED APPLICATIONS

This application claims priority under 35 U.S.C. § 119 to Korean Patent Application No. 10-2022-0078613, filed on Jun. 28, 2022, in the Korean Intellectual Property Office, the disclosure of which is incorporated herein by reference in its entirety.

TECHNICAL FIELD

The following disclosure relates to an adaptive sound control system and method of an active sound design (ASD) system, and more particularly, to an adaptive sound control system and method of an ASD system capable of actively controlling an output sound by an ASD system in consideration of noise generated while driving.

BACKGROUND

An active sound design (ASD) system synthesizes and outputs an engine sound of a vehicle by using a sound reinforcement technique to change or improve a sound inside and outside the vehicle in the vehicle.

Recently, as the demand for eco-friendly engines increases, efficiency of an engine system increases, but auditory satisfaction to a vehicle passenger decreases. In addition, electric and fuel cell vehicles generate a high-pitched sound that a general combustion engine does not have.

Accordingly, in order to satisfy the emotional quality of engine sound to a vehicle passenger, the ASD system is applied to generate and output virtual engine sound/synthetic engine sound through a speaker.

However, in all sound source systems, when the background noise increases, since the output noise becomes difficult to hear, the ASD system also implements an adaptive volume control function according to a vehicle speed so that an output sound (engine sound) may be audible well. However, since the vehicle speed itself is not a factor determining a general background noise level, the ASD system includes a problem to be described later.

In detail, typical noises of a vehicle include road surface noise, wind noise, and engine noise. When a vehicle is at a low speed, road surface noise emerges as a large noise source, and when a vehicle is at a high speed, wind noise becomes a major noise source.

Such road surface noise or wind noise is greatly affected by not only a vehicle speed, but also ground conditions, a wind direction, and the like. That is, even if the adaptive sound control function according to the speed is implemented by the conventional ASD system, on a road where a headwind flows or a lot of noise occurs while driving at the same speed, there is a problem in that the background noise caused by road surface noise or wind noise increases, so the output sound is not audible well and it is difficult for a passenger to obtain auditory satisfaction.

Korean Patent Publication No. 10-2139916 ("Method for active sound design of vehicle") discloses a technology of stably outputting an engine sound of a vehicle by shifting a phase arrangement of each speaker according to the detected engine speed (RPM) when implementing a virtual engine sound.

SUMMARY

An embodiment of the present invention is directed to providing an adaptive sound control system and method of an ASD system capable of additionally actively controlling an output sound by an ASD system controlled in consideration of only a vehicle speed in response to an in-vehicle noise level.

In one general aspect, an adaptive sound control system of an active sound design (ASD) system may include: a state input unit configured to receive an operation state of at least one infotainment device mounted on a vehicle; an audio input unit configured to receive an audio signal generated from an inside of the vehicle when the received operation state is a preset active controllable state; a signal conversion unit configured to convert the received audio signal into image data; a network performance unit configured to input the converted image data to a learning-processed classification network and classify and output whether the image data is data generated by noise generated while driving or the image data is data generated by a passenger's voice; a driving input unit configured to receive driving information (i.e., driving-related information) of the vehicle when the image data is the data generated by the noise as the output result; and an active control unit configured to calculate first noise level information generated while driving by using the received driving-related information and the audio signal, and compare the calculated first noise level information with second noise level information preset by the ASD system to actively control an output sound by the ASD system.

The adaptive sound control system may further include: a reduction controller configured to control to reduce the output sound by the ASD system to a preset value when the received operation state is a call function providing state.

The adaptive sound control system may further include: a network learning unit configured to perform learning processing of a pre-stored classification network and provide a final learning-processed classification network to the network performing unit, in which the network learning unit may include: a database unit configured to collect a plurality of audio signals generated from the inside of the vehicle and perform labeling on each of the collected audio signals to generate, store, and manage label data; a conversion unit configured to convert each of the audio signals into the image data; and a learning unit configured to perform the learning processing by inputting label data matching the image data to the pre-stored classification network, and weights for each layer constituting the classification network may be updated and set using a preset loss function and an optimization technique based on an output value according to the learning processing result.

The driving input unit may receive the driving-related information including engine RPM information and speed information of the vehicle.

The active control unit may include: a first DB generation unit configured to extract, store, and manage an RPM-based non-applied order value using a plurality of order values applied in a process of setting a frequency of the output sound in advance based on an RPM band in the ASD system; a non-applied order extraction unit configured to extract an non-applied order value matching the input engine RPM information using the non-applied order value stored by the first DB generating unit; a non-output frequency calculation unit configured to calculate a non-output frequency in the ASD system using the non-applied order value extracted by the non-applied order extraction unit and the input engine RPM information; and a driving noise calculator configured to obtain a frequency band formed by converting the input audio signal, calculate noise level information generated in a band corresponding to the calculated non-output frequency, and set the calculated noise level information as the first noise level information.

The active control unit may further include: a second DB generation unit configured to calculate, store, and manage noise level information generated while driving according to a vehicle speed in the process of setting the output sound in advance based on the vehicle speed in the ASD system; a speed noise calculation unit configured to extract noise level information matching the input speed information by using the noise level information stored by the second DB generation unit and sets the extracted noise level information as the second noise level information; and an ASD sound control unit configured to compare the first noise level information by the driving noise calculation unit and the second noise level information by the speed noise calculation unit, and control to increase the output sound by the ASD system when the first noise level information is larger as the comparison result, and the ASD sound control unit may control to increase the output sound by the ASD system in response to the difference value.

When the first noise level information is smaller as the comparison result, the ASD volume sound unit may control to reduce the output sound by the ASD system in response to the difference value.

In another general aspect, an adaptive sound control method of an active sound design (ASD) system using an adaptive sound control system of an ASD system in which each step is performed by a calculation processing means may include: a state input step (S100) of receiving an operation state of at least one infotainment device mounted on a vehicle; a first determination step (S200) of determining whether the operation state received by the state input step (S100) is a preset active controllable state; an audio input step (S300) of receiving an audio signal generated from an inside of the vehicle when the operation state is the active controllable state as the determination result of the first determination step (S200); a signal conversion step (S400) of converting the audio signal received by the audio input step (S300) into image data; a network performance step (S500) of inputting the image data converted by the signal conversion step (S400) to a learning-processed classification network and classifying and outputting whether the image data is data generated by noise generated while driving or the image data is data generated by a passenger's voice; a second determination step (S600) of determining whether the image data is the data generated by the noise as the output result in the network performance step (S500); a driving input step (S700) of receiving driving-related information including engine RPM information and speed information of the vehicle when the image data is the data generated by the noise as the determination result in the second determination step (S600); and an active control step (S800) of calculating noise level information generated while driving using the driving-related information by the driving input step (S700) and the audio signal received by the audio input step (S300) and actively controlling the output sound by the ASD system by comparing the calculated first noise level information with the second noise level information preset by the ASD system.

The adaptive sound control method may further include: prior to performing the network performing step (S500), a learning data set generating step (S10) of collecting a plurality of audio signals generated from the inside of the vehicle, converting each of the collected audio signals into image data, and performing labeling on each of the collected audio signals to generate labeling data; and a learning processing step (S20) of performing learning-processing by inputting label data matching the image data by the learning data set generation step (S10) to a pre-stored classification network, in which in the learning processing step (S20), weights for each layer constituting the classification network may be updated and set using a preset loss function and an optimization technique based on a network output value according to the learning-processing result, and in the network performance step (S500), a final learning-processed classification network may be used by the learning processing step (S20).

The active control step (S800) may include: a non-applied order extraction step (S810) of extracting a non-applied order value matching engine RPM information by the driving input step (S700) using an extracted RPM-based non-applied order value DB by using a plurality of order values applied in a process of setting a frequency of the output sound in advance based on an RPM band in the ASD system; a non-output frequency calculation step (S820) of calculating a non-output frequency in the ASD system using the non-applied order value extracted by the non-applied order extraction step (S810) and the engine RPM information by the driving input step (S700); and a driving noise calculation step (S830) of obtaining a frequency band formed by converting the audio signal received by the audio input step (S300), calculating noise level information generated in the band corresponding to the non-output frequency calculation step (S820) among the obtained frequency bands, and setting the calculated noise level information as the first noise level information.

The active control step (S800) may further include: a speed noise calculation step (S840) of extracting noise level information matching speed information by the driving input step (S700) using a noise level information DB generated while driving according to a vehicle speed in a process of setting the output sound in advance based on the vehicle speed in the ASD system, and setting the extracted noise level information as the second noise level information; and an ASD sound control step (S850) of controlling to increase or decrease the output sound by the ASD system in response to a difference value by comparing the first noise level information by the driving noise calculation step (S830) with the second noise level information by the speed noise calculation step (S840).

In the ASD sound control step (S850), when the first noise level information is larger, the output sound of the ASD system may be controlled to increase, and when the first noise level information is smaller, the output sound of the ASD system may be controlled to decrease.

DETAILED DESCRIPTION

Hereinafter, a preferred embodiment of an adaptive sound control system of an ASD system and method according to the present invention will be described in detail with reference to the accompanying drawings.

A system means a set of components including devices, mechanisms, means, and the like, systematized in order to perform required functions and regularly interacting with one another.

As described above, typical noise sources of a vehicle include road surface noise, wind noise, and engine noise. When a vehicle is driving at low speed, road surface noise emerges, but when a vehicle is driving at a high speed, wind noise becomes a major noise source. That is, since a background noise level varies according to the vehicle speed, the conventional ASD system actively controls an output of a virtual engine sound/synthetic engine sound according to the vehicle speed in consideration of the background noise level to provide auditory satisfaction to a passenger.

However, since a volume control function according to the vehicle speed does not take into account the road surface noise and the wind noise that change depending on a road surface condition or a wind direction, when a vehicle is driving at the same speed, the background noise level varies on a road where a headwind blows or a lot of noise occurs, so there is a problem in that it is difficult for a driver to feel the engine sound output by the ASD system.

In order to solve this problem, the adaptive sound control system of an ASD system and method according to an embodiment of the present invention relate to a technology for dividing whether a sound generated in a driving vehicle is background noise or noise (conversation, etc.) intentionally generated by a driver by using a classification network, and actively controlling a volume of an output engine sound by the ASD system by calculating a background noise level for the divided background noise in a frequency band independent of the control of the ASD system.

Accordingly, since the ASD output can be adjusted according to the background noise by dividing between a sound (conversation, etc.) intended by a passenger in the vehicle and the background noise (noise such as road surface noise, wind noise, and engine sound), it has the advantage of improving the auditory satisfaction by transferring the engine sound (engine sound targeted at the vehicle development stage) with the same feeling to a passenger without being affected by the road surface conditions or wind directions.

Figure 1:
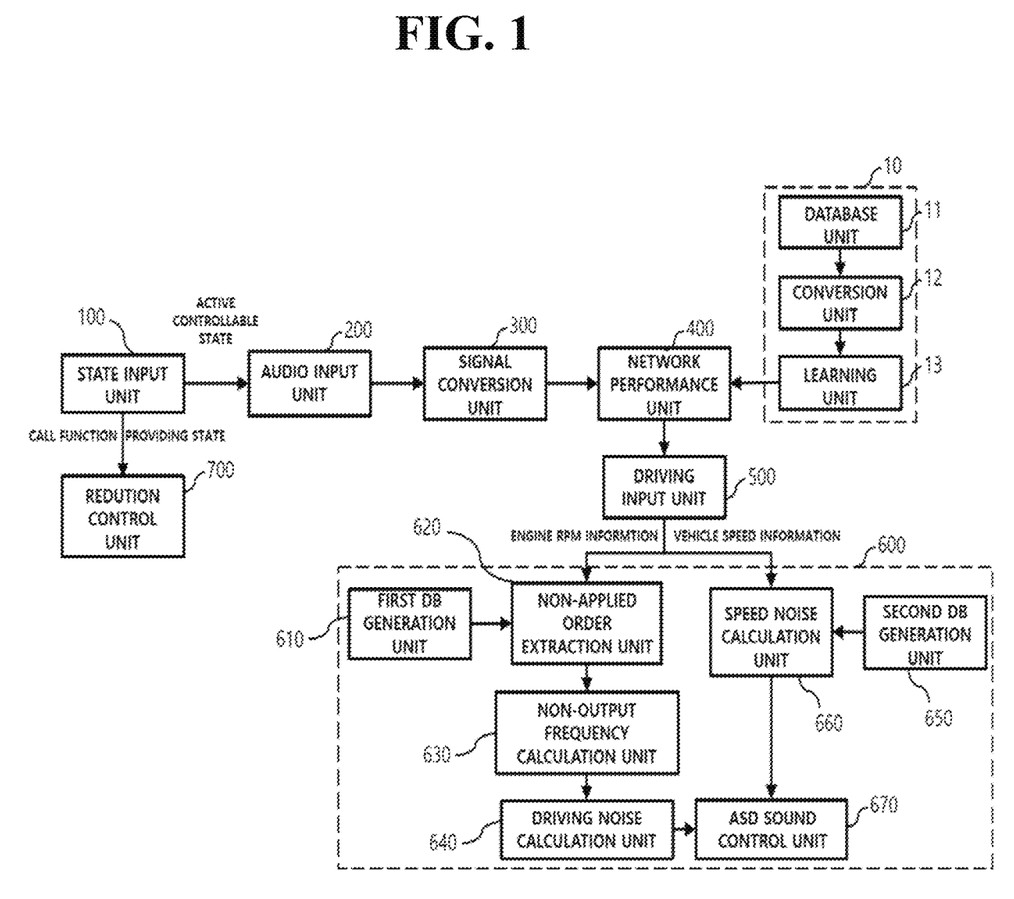
FIG. 1 is an exemplary configuration diagram illustrating an adaptive sound control system of an ASD system according to an embodiment of the present invention.

FIG. 1 illustrates a configuration diagram of an adaptive sound control system of an active sound design (ASD) system according to an embodiment of the present invention.

As illustrated in FIG. 1, the adaptive sound control system of an ASD system according to the embodiment of the present invention may include a state input unit 100, an audio input unit 200, a signal conversion unit 300, a network performance unit 400, a driving input unit 500, and an active control unit 600. Each of the components preferably performs an operation through a calculation processing means such as an ECU including a computer that performs transmission and reception through an in-vehicle communication channel.

In addition, the adaptive sound control system of an ASD system according to the embodiment of the present invention most basically generates a virtual engine sound or a synthetic engine sound according to RPM engine information of a current vehicle and changes a volume of the generated virtual engine sound or synthetic engine sound according to a vehicle speed to provide the changed volume to a passenger to stably provide an engine sound mood suitable for a brand of a vehicle to the passenger, thereby controlling a vehicle with the ASD system designed and applied to increase auditory satisfaction.

In the process of developing a vehicle, the ASD system enables an engine sound suitable for a brand of a vehicle to be output to the inside/outside of the vehicle in addition to the engine sound that is actually generated, thereby representing brand identity of the vehicle and improving auditory satisfaction of a passenger.

In general, while designing the ASD system for the vehicle, a harmonic chord suitable for the brand of the vehicle is set, and a target sound (engine output sound/virtual output sound/synthetic output sound) is output by applying an engine order value matching the chord.

However, even when driving at the same vehicle speed, since a background noise level (in-vehicle background noise) varies depending on a road noise condition or a wind direction, there is a problem in maintaining auditory satisfaction of a passenger when the volume of the engine output sound is controlled and provided by simply using a vehicle speed.

In consideration of this, the adaptive sound control system of an ASD system according to the embodiment of the present invention controls the volume of the engine output sound by the ASD system in consideration of not only the vehicle speed but also the current noise (background noise) in the vehicle, but determines whether the current noise in the vehicle is noise (conversation, etc.) according to an intention of a passenger or unintended external conditions (road surface state, wind direction, etc.).

In addition, since the engine output sound by the ASD system, which is being performed in the process of determining the sound and noise, needs to be considered, it is possible to more accurately transfer the engine sound with the same feeling to a passenger by determining the sound and noise for a frequency band that is not used in generating the engine output sound in the ASD system, that is, the ASD engine output sound frequency band.

Each configuration that performs these operations will be described in detail.

The state input unit 100 receives an operation state of at least one infotainment device mounted on a vehicle. In detail, when an operation state of audio video navigation (AVN) is input to a vehicle and music is playing, the operation of the ASD system stops so that the engine sound output by the ASD system does not act as an obstacle to the passenger listening to music. Stopping the operation of the ASD system by the music playback corresponds to the existing setting control of the ASD system.

The audio input unit 200 receives an audio signal generated from the inside of the vehicle when the operation state received by the state input unit 100 is not a preset active controllable state, that is, not the music playback state or a call function providing state.

In this case, the audio signal is input through a microphone module pre-mounted in a vehicle, and since the microphone module is typically mounted to provide a call function, an audio signal generated from the inside of the vehicle may be collected through the microphone module.

In this case, in the adaptive sound control system of an ASD system according to the embodiment of the present invention, when the operation state received by the state input unit 100 is not the music playback state, but is a call function providing state, the operation of the reduction control unit 700 is performed.

The reduction control unit 700 controls the output sound by the ASD system to decrease to a preset value. In detail, the output sound by the ASD system is controlled to decrease so that the engine sound output by the ASD system does not act as an interference source in a passenger's call. In this case, a predetermined value may be set to a degree that a call is not disturbed during the actual vehicle design of the ASD system. Since the predetermined value is set differently based on basic engine noise of the vehicle and specifications (noise shielding glass, etc.) of the vehicle, the predetermined value itself is not limited.

The signal conversion unit 300 converts an audio signal input through the audio input unit 200 into image data.

In detail, the signal conversion unit 300 may calculate a Mel-frequency Cepstral Coefficient (MFCC) of an audio signal input through the audio input unit 200 or convert the audio signal into image data using a Mel-Spectrogram.

When the audio signal is a signal on a time axis, the converted MFCC may know the amount of change in frequency over time through a signal in a frequency domain. In addition, since a Mel Filter Bank technique configured to convert the audio signal concentrates and analyzes a signal in a human voice region, the audio signal input through the audio input unit 200 is converted into image data in which a portion of the human voice region is intensively displayed.

Based on this point, an audio signal by a human voice and an audio signal that is not a human voice will be classified later through a classification network, which will be described later.

The network performance unit 400 inputs the image data converted by the signal conversion unit 300 into the learning-processed classification network in advance to classify and output whether the image data is data due to noise generated while driving, or data due to the passenger's voice.

That is, the network performance unit 400 determines whether the audio signal generated within or from the inside of the vehicle collected through the classification network is a sound (conversation, etc.) intentionally generated by the passenger or a sound by external conditions (driving noise (engine sound, wind sound, road surface noise etc.)).

In this case, in order to perform the learning processing of the classification network in advance, as illustrated in FIG. 1, a network learning unit 10 is further included.

The network learning unit 10 performs learning-processing of the pre-stored classification network in advance, and provides the final learning-processed classification network to the network performance unit 400.

Various sounds such as conversation sound between passengers, music sound, call sound, and background noise (wind noise, road surface noise, and engine sound) may occur in the vehicle. Therefore, in order to adjust the volume of the engine sound output by the ASD system according to the background noise, it is necessary to classify the background noise and other conditions.

When the audio signal input while driving is unconditionally defined as the background noise level without taking various sounds into account, even if there is a conversation between passengers, the conversation is determined as noise, and thus, the engine sound output by the ASD system increases, which may cause problems that interfere with communication between passengers.

Accordingly, the learning process of the classification network for classifying into background noise and other states is performed through the network learning unit 10.

Figure 2:
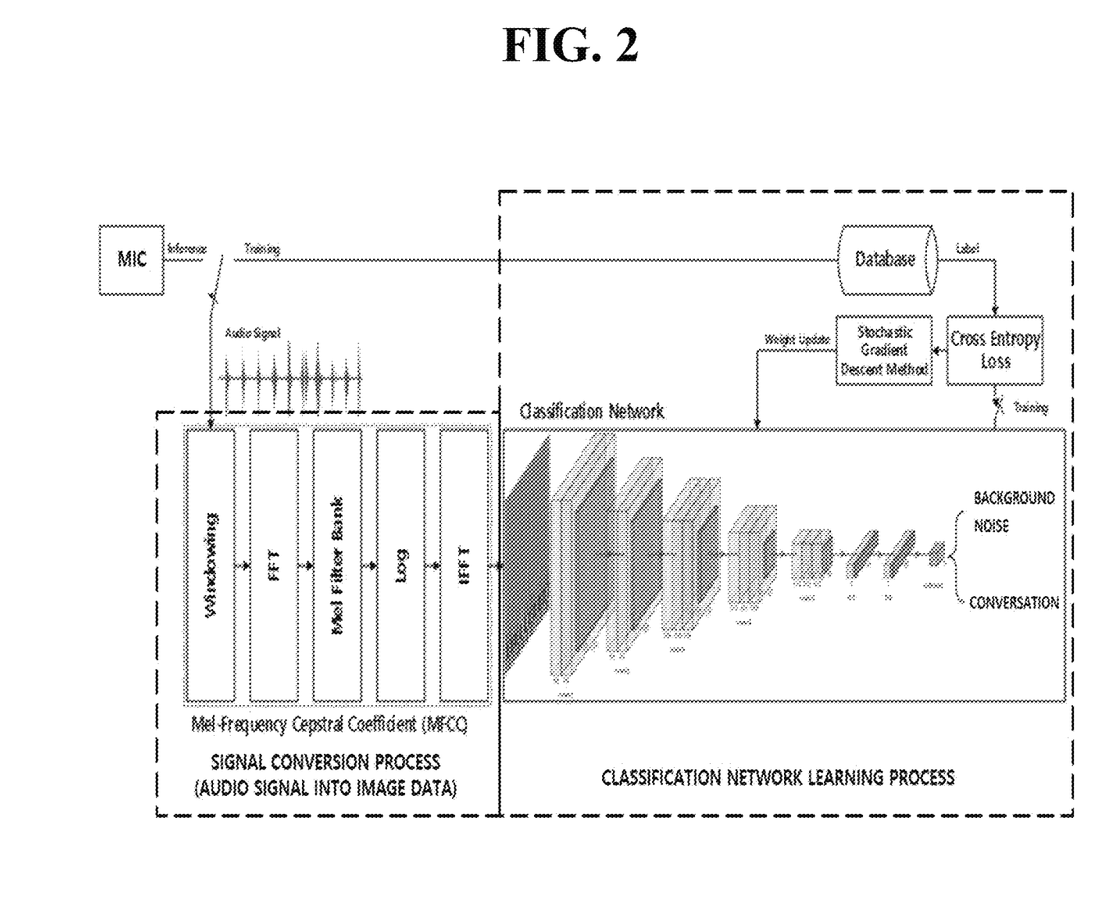
FIG. 2 is an exemplary diagram illustrating an application process of a classification network by an adaptive sound control system and method of an ASD system according to an embodiment of the present invention.

To this end, the network learning unit 10 includes a database unit 11, a conversion unit 12, and a learning unit 13, and the operation of the network learning unit 10 may be described as illustrated in FIG. 2.

The database unit 11 generates a learning data set, and collects various types of audio signals generated from the inside of the vehicle, and performs labeling on each of the collected audio signals to generate label data (background noise (noise) or conversation). By matching each audio signal and the label data, the label data is stored and managed as the learning data set.

In this case, most preferably, by collecting audio signals in various situations that may occur inside the vehicle, such as by vehicle, by vehicle model, by various road surface states, by various weather conditions, and by vehicle speed, a rich learning data set is generated.

The conversion unit 12 converts each audio signal into image data. In this case, similar to the above-described signal conversion unit 300, in the signal conversion, the MFCC of the audio signal is calculated (see FIG. 2) or converted into the image data using the Mel-Spectrogram.

In addition, the label data matches the image data converted from the learning data set by the database unit 11, and is stored and managed.

The learning unit 13 inputs the learning data set, that is, the label data matching the image data, to the pre-stored classification network, and performs supervised learning-processing on the learning data set.

As illustrated in FIG. 2, the learning process inputs the learning data set to the classification network, performs the learning and then inputs any one image data to be selected, compares the output data to the input data with the label data to perform learning-processing so that a difference between the output data and the label data are minimized using a preset loss function, and updates and sets weights for each layer constituting the classification network using a preset optimization technique.

In detail, the most widely used a cross entropy loss in the classification network is used as the preset loss function, and the preset optimization technique also uses the most widely used stochastic gradient descent method to input the learning data set into the classification network, the loss function between the output data and the label data is obtained, and learning is performed while updating and setting the weights for each layer through the optimization technique so that the loss function is minimized.

The network performance unit 400 uses the final learning-processed classification network through the above-described process through the network learning unit 10 to classify whether the audio signal generated from the inside of the vehicle while driving is data due to noise generated while driving and whether the audio signal is data due to the passenger's voice.

In this case, as a result of the classification of the network performance unit 400, the adaptive sound control system of an ASD system according to the embodiment of the present invention performs the operation of the reduction control unit 700 when the audio signal generated from the inside of the vehicle while driving is data due to the passenger's voice.

That is, the reduction control unit 700 controls the output sound by the ASD system to decrease to the preset value.

As a result of classification of the network performance unit 400, the driving input unit 500 receives driving-related information of the vehicle when the audio signal generated from the inside of the vehicle while driving is data due to noise generated while driving.

Here, the driving-related information of the vehicle includes engine RPM information and speed information of the vehicle being driven.

The active control unit 600 uses the driving-related information received by the driving input unit 500 and the audio signal received by the audio input unit 200 to calculate first noise level information generated while driving, that is, a level of noise actually generated while driving.

In addition, the active control unit 600 extracts second noise level information preset by the ASD system, that is, a sound level due to the engine sound output by the ASD system in consideration of the vehicle speed.

Accordingly, the active control unit 600 compares the calculated first noise level information with the extracted second noise level information, thereby adaptively and actively controlling the output sound by the ASD system.

In general, since the ASD system continuously outputs the engine sound when activated, the audio signal generated from the inside of the vehicle while driving may include the output sound of the ASD system. That is, the performance result of the network performance unit 400 may be classified, as noise, the background sound deliberately generated by the ASD system, not the actual noise generated while driving.

Describing more easily, when the active control unit 600 does not divide the background sound (synthetic engine sound or virtual engine sound) deliberately generated by the ASD system, an unexpected problem of reducing the volume of the sound deliberately provided to give the auditory satisfaction to the passenger may be caused. Therefore, in order to prevent such a problem in advance, the noise level actually generated while driving in a band not used by the ASD system is calculated.

In order to perform the analysis on the band not used by the ASD system, the basic setting of the ASD system should be considered.

In general, when designing an actual vehicle, the ASD system determines an output frequency by applying an order value according to the engine RPM information through Equation 1 below.

$$\text{frequency} = \frac{\text{engine } RPM \text{ information}}{60} \text{ order value}$$

In this case, instead of one or two order values, a plurality of order values are applied according to the engine specifications of the vehicle.

For example, in the case of a four-cylinder engine, a second order and a fourth order are applied, and in the case of a six-cylinder engine, a second order, a 4.5th order, and a sixth order are applied.

As an example, when it is designed to output the engine sound using the second, 4.5th, and sixth orders, at 2000 RPM, the output frequency by the ASD system will be modulated into the 66 Hz, 150 Hz, and 200 Hz bands.

Therefore, when it is determined that the audio signal generated from the inside of the vehicle while driving is data due to noise generated while driving since there is no conversation between passengers, the output sound of the ASD system is included, not the actual noise generated by driving.

In consideration of this, when the frequency band of the order value not used by the ASD system is extracted and the noise level information (noise information) of the corresponding band is calculated, the noise level information corresponds to noise level information due to noise generated by pure driving in which the output sound of the ASD system is omitted.

As illustrated in FIG. 1, the active control unit 600 performing this operation includes a first database (DB) generation unit 610, a non-applied order extraction unit 620, a non-output frequency calculation unit 630, a driving noise calculation unit 640, a second DB generation unit 650, a speed noise calculation unit 660, and an ASD sound control unit 670.

The first DB generation unit 610 extracts, stores, and manages an RPM-based non-applied order value using a plurality of order values applied in the process of setting the frequency of the output sound in advance based on the RPM band in the ASD system.

That is, as described above, the first DB generation unit 610 uses the plurality of order values applied in the process of setting the frequency of the output sound based on the RPM band in the ASD system to store and manage order values not applied to each RPM band, and most preferably, stores and manages the non-applied order values in the form of a look-up table.

Figure 3:
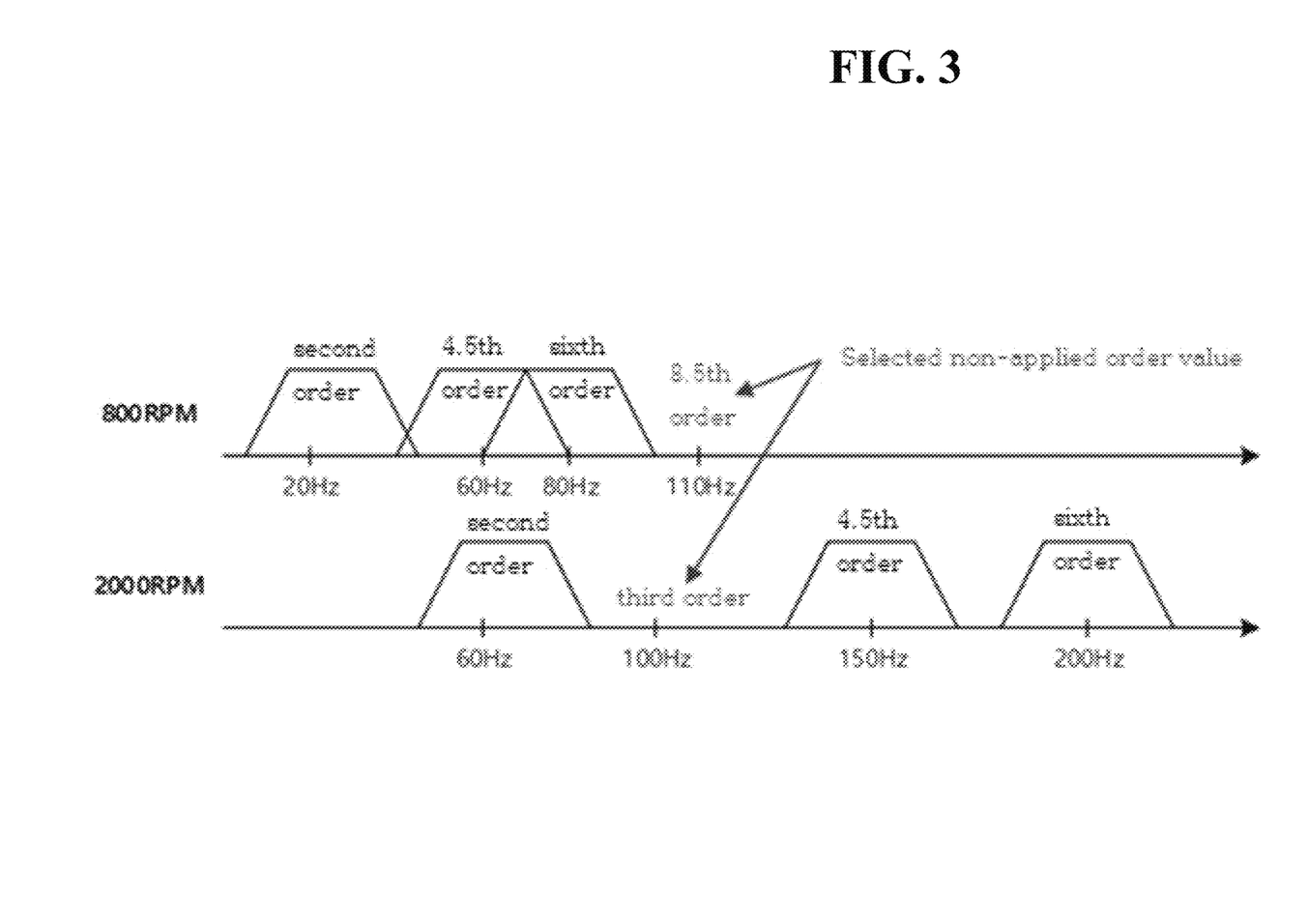
FIG. 3 is an exemplary diagram illustrating a process of extracting an RPM-based non-applied order value by the adaptive sound control system and method of an ASD system according to the embodiment of the present invention.

For example, in the process of designing the ASD system, as illustrated in FIG. 3, when the second, 4.5th, and sixth orders are applied, at 800 RPM, the 8.5th order is analyzed and stored as a non-applied order value, and at 2000 RPM, the third order is analyzed and stored as the non-applied order value.

The non-applied order extraction unit 620 uses the RPM-based non-applied order value stored by the first DB generation unit 610 to extract the non-applied order value corresponding to the engine RPM information of the currently driving vehicle received by the driving input unit 500.

That is, a non-applied order value, which is an order value corresponding to an unused frequency band, not the frequency band applied to generate the engine output sound by the ASD system, is extracted according to the engine RPM information of the currently driving vehicle.

The non-output frequency calculation unit 630 applies the non-applied order value extracted by the non-applied order extraction unit 620 and the engine RPM information of the currently driving vehicle received by the driving input unit 500 to Equation 1 above, thereby calculating the non-output frequency in the ASD system.

In other words, the non-output frequency calculation unit 630 extracts a frequency band according to an order value not used by the ASD system.

The driving noise calculation unit 640 converts the audio signal received by the audio input unit 200 to obtain frequency bands, and calculates noise level information generated in the non-output frequency band calculated by the non-output frequency calculation unit 630 among the obtained frequency bands.

In this case, the calculated noise level information is set as the first noise level information.

Briefly summarizing the driving noise calculation unit 640, the noise level information due to noise generated by the pure driving in which the output sound of the ASD system is omitted is calculated.

In detail, the driving noise calculation unit 640 may Fourier transform the audio signal received by the audio input unit 200 to obtain the frequency band corresponding to the audio signal.

Thereafter, average power P of the non-output frequency band calculated by the non-output frequency calculation unit 630 is calculated using Equation 2 below to calculate the first noise level information.

$$P = \frac{1}{f_1 - f_0} \int_{f_0}^{f_1} |X(f)|^2 df \quad \text{[Equation 2]}$$

(Here, X(f) is a Fourier-transformed audio signal, which is defined as $X(f) = \int x(t)e^{-j2\pi ft} dt$.)

The first noise level information calculated in this way corresponds to at least pure sound that is not affected by the output sound by the ASD system, that is, the background noise level generated while driving independently calculated without the output sound of the ASD system or the passenger's voice.

The second DB generation unit 650 calculates, stores, and manages the noise level information generated while driving according to the vehicle speed in the process of setting the output sound in advance based on the vehicle speed in the ASD system.

The ASD system performs sound tuning in the actual vehicle design stage. Since noise according to external conditions increases as the vehicle speed increases, the degree of variation of the output sound by the ASD system is set for each speed through the sound tuning.

In consideration of this point, the second DB generation unit 650 stores and manages the background noise level information measured as a tuning result in the tuning process in the form of the lookup table based on the vehicle speed.

Of course, the measured background noise level information means the average power P of the frequency band of the output sound of the ASD system, which calculates the average power of the output frequency band in consideration of Equation 2 above.

The speed noise calculation unit 660 uses the noise level information generated while driving according to the vehicle speed stored by the second DB generation unit 650 to extract the noise level information matching the speed information of the currently driving vehicle received by the driving input unit 500.

In this case, the extracted noise level information is set as the second noise level information.

Here, the second noise level information means that, in consideration of the speed of the currently driving vehicle, the corresponding vehicle is designed to hear the output sound of the ASD system in consideration of at least the background noise corresponding to the second noise level information.

The ASD sound control unit 670 compares the first noise level information by the driving noise calculation unit 640 and the second noise level information by the speed noise calculation unit 660, and controls to increase the output sound by the ASD system when the first noise level information is larger as the comparison result.

Briefly summarizing, since the fact that the first noise level information is larger means that the actual inside of the vehicle is noisier than the background noise level information expected in the tuning step based on the speed of the currently driving vehicle, the engine sound with the same feeling is output, and thus, the output sound of the ASD system is controlled to increase to improve the passenger's auditory satisfaction.

In this case, it is preferable that the ASD sound control unit 670 controls to increase the output sound in response or proportionally to a difference value between the first noise level information and the second noise level information.

That is, when an excessively loud sound is suddenly output without considering the difference value between the first noise level information and the second noise level information, since it is possible to rather provide the passenger's auditory dissatisfaction, by controlling to increase the output sound in response to the passenger's auditory dissatisfaction, the passenger may feel the output of the engine sound with the same feeling.

On the other hand, when the first noise level information is smaller than the second noise level information as a result of the comparison, that is, when the inside of the actual vehicle is quieter than the background noise level information expected in the tuning stage based on the speed of the currently driving vehicle, the ASD sound control unit 670 outputs the engine sound with the same feeling while being suitable for a quieter environment, and thus, controls to decrease the output sound of the ASD system to improve the passenger's auditory satisfaction.

Also in this case, it is preferable to control to decrease the output sound in response or proportionally to the difference value between the first noise level information and the second noise level information.

Figure 4:
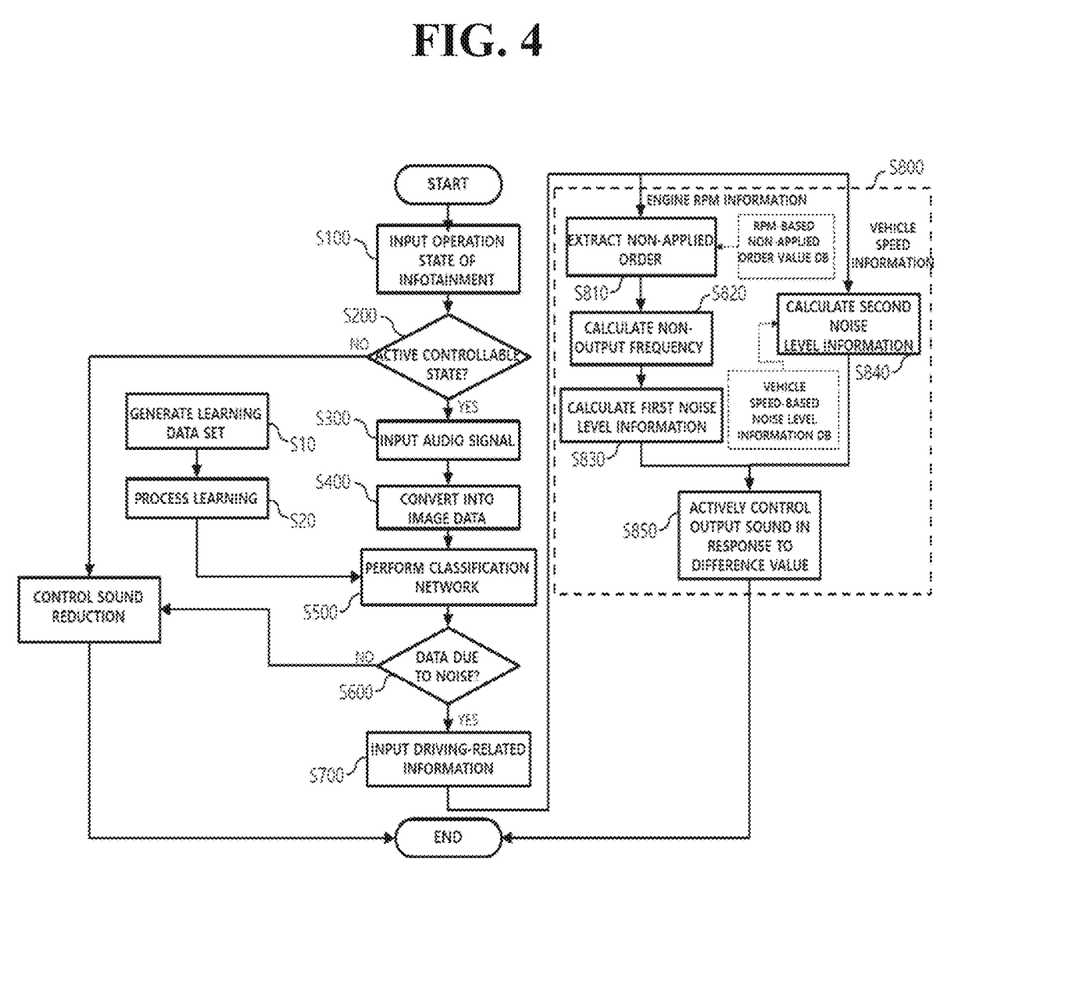
FIG. 4 is a flowchart illustrating an adaptive sound control method of an ASD system according to an embodiment of the present invention.

FIG. 4 illustrates a flowchart of an adaptive sound control method of an ASD system according to an embodiment of the present invention.

As illustrated in FIG. 4, the adaptive sound control method of an ASD system according to the embodiment of the present invention may include a state input step (S100), a first determination step (S200), an audio input step (S300), a signal conversion step (S400), a network performance step (S500), a second determination step (S600), a driving input step (S700), and an active control step (S800). Each step is preferably performed using the adaptive sound control system of an ASD system operated by calculation processing means.

Each step will be described in detail.

In the state input step (S100), the operation state of at least one infotainment device mounted on the vehicle is received from the state input unit 100 which is the calculation processing means. In detail, the operation state of the AVN is input to a vehicle.

In this case, as illustrated in FIG. 4, when the received operation state is a music playback state, the operation of the ASD system stops, so the engine sound output by the ASD system does not act as an obstacle to the passenger listening to music. Stopping the operation of the ASD system by the playback of music corresponds to the existing setting control of the ASD system.

In the first determination step (S200), the state input unit 100, which is the calculation processing means, determines whether the operation state received by the state input step (S100) is a preset active controllable state.

Here, the preset active controllable state means not the music playback state, nor the call function providing state.

In the audio input step (S300), the audio input unit 200, which is the calculation processing means, receives the audio signal generated from the inside of the vehicle when it is in the preset active controllable state as a result of the determination in the first determination step (S200).

In this case, the audio signal is input through a microphone module pre-mounted in a vehicle, and since the microphone module is typically mounted to provide a call function, an audio signal generated from the inside of the vehicle may be collected through the microphone module.

In addition, as illustrated in FIG. 4, as a result of the determination of the first determination step (S200), the operation state received by the state input step (S100) is not the music playback state, but when the operation state is the call function providing state, the output sound of the ASD system is controlled to decrease to a preset value. In detail, the output sound by the ASD system is controlled to decrease so that the engine sound output by the ASD system does not act as an interference source in a passenger's call. In this case, a predetermined value may be set to a degree that a call is not disturbed during the actual vehicle design of the ASD system. Since the predetermined value is set differently based on basic engine noise of the vehicle and specifications (noise shielding glass, etc.) of the vehicle, the predetermined value itself is not limited.

In the signal conversion step (S400), the signal conversion unit (300), which is the calculation processing means, converts the audio signal received by the audio input step (S300) into the image data.

In detail, in the signal conversion step (S400), the Mel-frequency Cepstral Coefficient (MFCC) of the audio signal input by the audio input step (S300) may be calculated or may be converted into the image data using the Mel-Spectrogram.

When the audio signal is a signal on a time axis, the converted MFCC may know the amount of change in frequency over time through a signal in a frequency domain. In addition, since the Mel Filter Bank technique configured to convert into the MFCC concentrates and analyzes a signal in a human voice region, the received audio signal input is converted into image data in which a portion of the human voice region is intensively displayed.

In the network performance step (S500), the network performance unit (400), which is the calculation processing means, inputs the image data converted by the signal conversion step (S400) to the learning-processed classification network to classify and output whether the image data is data due to noise generated while driving or whether the image data is data due to the passenger's voice.

That is, it is determined whether the audio signal generated from the inside of the vehicle collected through the classification network is a sound (conversation, etc.) intentionally generated by the passenger or a sound that is not intentionally generated by the passenger but is generated by external conditions (driving noise (engine sound, wind sound, road surface noise etc.)).

In this case, in order to perform learning-processing of the classification network in advance, as illustrated in FIG. 4, prior to performing the network performing step (S500), the learning data set creation step (S10) and the learning processing step (S20) are performed.

In the learning data set generation step (S10), the network learning unit 10, which is the calculation processing means, collects various types of audio signals generated from the inside of the vehicle, and performs labeling on each of the collected audio signals to label data (background noise or conversation). By matching each audio signal and the label data, the label data is stored and managed as the learning data set.

In this case, most preferably, by collecting audio signals in various situations that may occur inside the vehicle, such as by vehicle, by vehicle model, by various road surface states, by various weather conditions, and by vehicle speed, a rich learning data set is generated.

In addition, each audio signal is converted into the image data, and the label data matching the converted image data is stored and managed.

In this case, similar to the process of the signal conversion step S400 described above, the conversion of the audio signal into the image data is performed by calculating the MFCC of the audio signal or converting the audio signal into image data using Mel-Spectrogram.

In the learning processing step (S30), the network learning unit 10, which is the calculation processing means, inputs the learning data set, that is, the label data matching the image data, to the pre-stored classification network, and performs the supervised learning-processing on the learning data set.

As illustrated in FIG. 2, the learning process inputs the learning data set to the classification network, performs the learning and then inputs any one image data to be selected, compares the output data to the input data with the label data to perform learning-processing so that a difference between the output data and the label data are minimized using a preset loss function, and updates and sets weights for each layer constituting the classification network using a preset optimization technique.

In detail, the most widely used a cross entropy loss in the classification network is used as the preset loss function, and the preset optimization technique also uses the most widely used a stochastic gradient descent method to input the learning data set into the classification network, the loss function between the output data and the label data is obtained, and learning is performed while updating and setting the weights for each layer through the optimization technique so that the loss function is minimized.

Accordingly, in the network performance step (S500), the final learning-processed classification network is used by the learning processing step (S20).

In the second determination step (S600), the driving input unit 500, which is a calculation processing means, determines whether the audio signal generated within or from the inside of the vehicle while driving is data due to noise generated while driving as a result of the classification by the network execution step (S500).

As a result of the determination of the second determination step (S600), when the audio signal is data due to noise, the driving input step (S700) is performed, and when the audio signal is not data due to noise, that is, data due to the passenger's voice, the output sound by the ASD system is controlled to decrease to the preset value.

In the driving input step (S700), when the driving input unit 500, which is the calculation processing means, determines that the audio signal generated from the inside of the vehicle while driving is data due to noise generated while driving, as a result of the determination in the second determination step (S600), the driving-related information of the vehicle is received.

Here, the driving-related information of the vehicle includes engine RPM information and speed information of the vehicle being driven.

In the active control step (S800), the active control unit 600, which is the calculation processing means, uses the driving-related information received by the driving input step (S700) and the audio signal received by the audio input step (S300) to calculate the first noise level information generated while driving, that is, the level of noise actually generated while driving.

In addition, the second noise level information preset by the ASD system, that is, the sound level due to the engine sound output by the ASD system in consideration of the vehicle speed is extracted.

Accordingly, the calculated first noise level information compares with the extracted second noise level information to adaptively and actively control the output sound by the ASD system.

That is, when the background sound (synthetic engine sound or virtual engine sound) deliberately generated by the ASD system is not divided, an unexpected problem of reducing the volume of the sound deliberately provided to give the auditory satisfaction to the passenger may be caused. Therefore, in order to prevent such a problem in advance, in the active control step (S800), the noise level actually generated while driving in a band not used by the ASD system is calculated.

In order to perform the analysis on the band not used by the ASD system, the basic setting of the ASD system should be considered.

In general, when designing an actual vehicle, the ASD system determines an output frequency by applying an order value according to the engine RPM information through Equation 1 above.

In this case, instead of one or two order values, a plurality of order values are applied according to the engine specifications of the vehicle.

For example, in the case of a four-cylinder engine, a second order and a fourth order are applied, and in the case of a six-cylinder engine, a second order, a 4.5th order, and a sixth order are applied.

As an example, when it is designed to output the engine sound using the second, 4.5th, and sixth orders, at 2000 RPM, the output frequency by the ASD system will be modulated into the 66 Hz, 150 Hz, and 200 Hz bands.

Therefore, when it is determined that the audio signal generated from the inside of the vehicle while driving is data due to noise generated while driving since there is no conversation between passengers, the output sound of the ASD system is included, not the actual noise generated by driving.

In consideration of this, when the frequency band of the order value not used by the ASD system is extracted and the noise level information (noise information) of the corresponding band is calculated, the noise level information corresponds to noise level information due to noise generated by pure driving in which the output sound of the ASD system is omitted.

To perform this operation, as illustrated in FIG. 4, the active control step (S800) includes a non-applied order extraction step (S810), a non-output frequency calculation step (S820), a driving noise calculation step (S830), a speed noise calculation step (S840), and an ASD sound control step (S850).

In the non-applied order extraction step (S810), by using an extracted RPM-based non-applied order value DB using a plurality of order values applied in the process of setting the frequency of the output sound in advance based on the RPM band in the ASD system, a non-applied order value matching the engine RPM information by the driving input step S700 is extracted.

Here, the RPM-based non-applied order value DB means a DB that stores and manages the non-applied order value for each RPM band in the form of the look-up table by using the plurality of order values applied in the process of setting the frequency of the output sound based on the RPM band in the ASD system.

In the non-applied order extraction step (S810), the non-applied order value corresponding to the received engine RPM information of the currently driving vehicle is extracted using the stored RPM-based non-applied order value DB.

That is, a non-applied order value, which is an order value corresponding to an unused frequency band, not the frequency band applied to generate the engine output sound by the ASD system, is extracted according to the engine RPM information of the currently driving vehicle.

In the non-output frequency calculation step (S820), the non-applied order value extracted by the non-applied order extraction step (S810) and the engine RPM information by the driving input step (S700) are applied to Equation 1 above to calculate the non-output frequency in the ASD system.

That is, the frequency band according to the order value not used by the ASD system is extracted.

In the driving noise calculation step (S830), the frequency bands formed by converting the audio signal received by the audio input step (S300) are obtained, and the noise level information generated in the band corresponding to the non-output frequency calculation step (S820) among the obtained frequency bands is calculated, and the noise level information is set as the first noise level information.

In detail, in the driving noise calculation step (S830), the noise level information due to noise generated by the pure driving in which the output sound of the ASD system is omitted is calculated.

That is, the frequency band corresponding to the audio signal may be obtained by performing a Fourier transform on the input audio signal.

Thereafter, the calculated average power P of the non-output frequency band is calculated for the first noise level information through Equation 2 above.

The first noise level information calculated in this way corresponds to at least pure sound that is not affected by the output sound by the ASD system, that is, the background noise level generated while driving independently calculated without the output sound of the ASD system or the passenger's voice.

In the speed noise calculation step (S840), the noise level information matching speed information by the driving input step (S700) is extracted using the noise level information DB generated while driving according to a vehicle speed in the process of setting the output sound in advance based on the vehicle speed in the ASD system, and the noise level information is set as the second noise level information.

Here, the noise level information DB generated while driving according to the vehicle speed means a DB that calculates, stores, and manages the noise level information generated while driving according to the vehicle speed in the process of setting the output sound based on the vehicle speed in the ASD system.

That is, the ASD system performs sound tuning in the actual vehicle design stage. Since noise according to external conditions increases as the vehicle speed increases, the degree of variation of the output sound by the ASD system is set for each speed through the sound tuning.

In consideration of this point, the background noise level information measured as a tuning result in the tuning process is stored and managed in the form of the lookup table based on the vehicle speed to generate the noise level information DB generated while driving according to the vehicle speed.

Of course, the measured background noise level information means the average power P of the frequency band of the output sound of the ASD system, which calculates the average power of the output frequency band in consideration of Equation 2 above.

In the speed noise calculation step (S840), the noise level information matching the received speed information of the currently driving vehicle is extracted by using the noise level information DB generated while driving according to the vehicle speed. Here, the second noise level information means that, in consideration of the speed of the currently driving vehicle, the corresponding vehicle is designed to hear the output sound of the ASD system in consideration of at least the background noise corresponding to the second noise level information.

In the ASD sound control step (S850), the first noise level information by the driving noise calculation step (S830) compares with the second noise level information by the speed noise calculation step (S840) to control to increase or decrease the output sound of the ASD system in response to the difference value.

In detail, in the ASD sound control step (S850), when the first noise level information is larger as a result of the comparison, the output sound of the ASD system controls to increase.

Briefly summarizing, since the fact that the first noise level information is larger means that the actual inside of the vehicle is noisier than the background noise level information expected in the tuning step based on the speed of the currently driving vehicle, the engine sound with the same feeling is output, and thus, the output sound of the ASD system is controlled to increase to improve the passenger's auditory satisfaction.

In this case, in the ASD sound control step (S850), it is preferable to control to increase the output sound in response to the difference value between the first noise level information and the second noise level information.

That is, when an excessively loud sound is suddenly output without considering the difference value between the first noise level information and the second noise level information, since it is possible to rather provide the passenger's auditory dissatisfaction, by controlling to increase the output sound in response to the passenger's auditory dissatisfaction, the passenger may feel the output of the engine sound with the same feeling.

In addition, when the first noise level information is smaller than the second noise level information as a result of the comparison, that is, when the inside of the actual vehicle is quieter than the background noise level information expected in the tuning stage based on the speed of the currently driving vehicle, the engine sound with the same feeling is output while being suitable for a quieter environment, and thus, the output sound of the ASD system is controlled to decrease to improve the passenger's auditory satisfaction.

Also in this case, it is preferable to control to decrease the output sound in response to the difference value between the first noise level information and the second noise level information.

As described above, according to the adaptive sound control system and method of the ASD system according to the present invention as described above, by using classification networks, it is possible to divide whether noise generated from an inside of a driving vehicle is noise generated by unintended external conditions (road surface condition, wind direction, etc.) or is noise intentionally generated by a driver (conversation, etc.), and by calculating the background noise level in the frequency band independent of the control of the ASD system for the divided background noise, it is possible to actively control a volume of an output engine sound of the ASD system.

In particular, the volume of the engine output sound by the ASD system is controlled in consideration of the current noise (background noise) in the vehicle as well as the speed of the vehicle, but it is not used in generating the engine output sound in the ASD system. In other words, the ASD engine output sound has the advantage of being able to more accurately transfer the engine sound with the same feeling to a passenger by determining the sound and noise in frequency bands other than the frequency band of the ASD engine output sound.

Accordingly, since the ASD output can be adjusted according to the background noise by accurately dividing between a sound (conversation, etc.) intended by a passenger in the vehicle and the background noise (noise such as road surface noise, wind noise, and engine sound), it has the advantage of improving the auditory satisfaction by transferring the engine sound (engine sound targeted at the vehicle development stage) with the same feeling to a passenger without being affected by the road surface conditions or wind directions.

The present invention is not limited to the above-described exemplary embodiments, but may be variously applied, and may be variously modified without departing from the gist of the present invention claimed in the claims.

What is claimed is:

1. An adaptive sound control system of an active sound design (ASD) system, comprising:
    a state input unit configured to receive an operation state of an infotainment device of a vehicle;
    an audio input unit configured to receive an audio signal generated within the vehicle in response to the received operation state being a preset active controllable state;
    a signal conversion unit configured to convert the received audio signal into image data;
    a network performance unit configured to input the converted image data to a learning-processed classification network configured to classify the image data and output whether the image data is noise data caused by a noise generated by driving of the vehicle or voice data caused by a passenger's voice;
    a driving input unit configured to receive driving information of the vehicle in response to the network performance unit outputting that the image data is the noise data; and
    an active control unit configured to:
        calculate, based on the driving information and the audio signal, first noise level information of the received audio signal;
        compare the calculated first noise level information with second noise level information preset by the ASD system; and
        control a sound output from the ASD system based on a result of comparing the first and second noise level information.

2. The adaptive sound control system of claim 1, further comprising a reduction controller configured to reduce the output sound from the ASD system to a preset value in response to the received operation state being a call function providing state.

3. The adaptive sound control system of claim 1, further comprising a network learning unit configured to perform learning-processing of a classification network to build the learning-processed classification network,
    wherein the network learning unit includes:

a database unit configured to collect a plurality of audio signals generated within the vehicle and labeling each of the collected audio signals to generate, store and manage label data;

a conversion unit configured to convert each of the collected audio signals into image data; and a learning unit configured to perform the learning-processing by inputting the label data corresponding to each piece of the image data to the classification network, and wherein a weight for each layer constituting the classification network is updated and set using a preset loss function and an optimization technique based on an output value according to a result from performing the learning-processing.

4. The adaptive sound control system of claim 1, wherein the driving information includes engine revolutions-per-minute (RPM) information and vehicle speed information.

5. The adaptive sound control system of claim 4, wherein the active control unit includes:

a first database (DB) generation unit configured to extract, store and manage an RPM-based non-applied order value using a plurality of order values applied in a process of the ASD system setting a frequency of the output sound based on an RPM band in the ASD system;

a non-applied order extraction unit configured to extract a non-applied order value corresponding to the engine RPM information using the non-applied order value managed by the first DB generating unit;

a non-output frequency calculation unit configured to calculate a non-output frequency in the ASD system using the extracted non-applied order value and the engine RPM information; and a driving noise calculation unit configured to obtain a frequency band formed by converting the input audio signal, calculate noise level information generated in a band corresponding to the calculated non-output frequency, and set the calculated noise level information as the first noise level information.

6. The adaptive sound control system of claim 5, wherein the active control unit further includes:

a second DB generation unit configured to calculate, store and manage noise level information generated based on a vehicle speed while driving of the vehicle in the process of the ASD system setting the output sound based on the vehicle speed;

a speed noise calculation unit configured to extract noise level information corresponding to the vehicle speed information by using the noise level information managed by the second DB generation unit and set the extracted noise level information as the second noise level information; and an ASD sound control unit configured to compare the first noise level information and the second noise level information, and increase the output sound by the ASD system in response to the first noise level information being greater than the second noised level information, and wherein the ASD sound control unit is configured to increase the output sound by the ASD system proportionally to a difference between the first and second noise level information.

7. The adaptive sound control system of claim 6, wherein, the ASD sound control unit is configured, in response to the first noise level information being smaller than the second noise level information, to reduce the output sound proportionally to the difference between the first and second noise level information.

8. An adaptive sound control method of an active sound design (ASD) system using an adaptive sound control system for an ASD system, the method comprising:

receiving an operation state of an infotainment device of a vehicle;

determining whether the operation state corresponds to a preset active controllable state;

in response to determining that the operation state corresponds to the preset active controllable state, receiving an audio signal generated within the vehicle;

converting the received audio signal into image data;

inputting the image data to a learning-processed classification network configured to classify the image data and output whether the image data is noise data caused by a noise generated while driving of the vehicle or voice data caused by a passenger's voice;

in response to the learning-processed classification network outputting that the image data is the noise data, receiving driving information of the vehicle including engine revolutions-per-minute (RPM) information and vehicle speed information;

calculating, based on the received driving information and the audio signal, first noise level information of the audio signal, and comparing the first noise level information with second noise level information preset by the ASD system; and controlling the sound output from the ASD based on a result of comparing the first and second noise level information.

9. The adaptive sound control method of claim 8, further comprising, prior to performing the network performing step, performing:

generating learning data including collecting a plurality of audio signals generated within the vehicle, converting each of the collected audio signals into image data, and labeling each of the converted audio signals to generate labeling data; and performing learning-processing including inputting the label data to a classification network, wherein, in performing the learning-processing, a weight for each layer constituting the classification network is updated and set using a preset loss function and an optimization technique based on a network output value according to a result from performing the learning-processing, and wherein performing the learning-processing is performed by the learning-processed classification network.

10. The adaptive sound control method of claim 8, wherein controlling the output sound from the ASD includes:

extracting a non-applied order value corresponding to the engine RPM information using an extracted RPM-based non-applied order value DB by using a plurality of order values applied in a process of the ASD system setting a frequency of the output sound based on an RPM band;

calculating a non-output frequency in the ASD system using the extracted non-applied order value and the engine RPM information; and obtaining a frequency band formed by converting the received audio signal, calculating noise level information generated in the RPM band corresponding to the calculated non-output frequency among the obtained frequency bands, and setting the calculated noise level information as the first noise level information.

11. The adaptive sound control method of claim 10, wherein controlling the output sound from the ASD further includes:

extracting noise level information matching the vehicle speed information using a noise level information DB generated while driving of the vehicle according to a vehicle speed in a process of the ASD system setting the output sound based on the vehicle speed, and setting the extracted noise level information as the second noise level information; and controlling the output sound by the ASD system in response to a difference between the first and second noise level information.

12. The adaptive sound control method of claim 11, wherein increasing or decreasing the output sound by the ASD system includes:

in response to the first noise level information being greater than the second noise level information, increasing the output sound of the ASD system, and in response to the first noise level information being smaller than the second noise level information, decreasing the output sound of the ASD system.

* * * * *